United States Patent
Wu

(10) Patent No.: US 9,601,660 B2
(45) Date of Patent: Mar. 21, 2017

(54) REVERSELY-INSTALLED PHOTONIC CRYSTAL LED CHIP AND METHOD FOR MANUFACTURING SAME

(71) Applicant: ENRAYTEK OPTOELECTRONICS CO., LTD., Shanghai (CN)

(72) Inventor: Leke Wu, Shanghai (CN)

(73) Assignee: ENRAYTEK OPTOELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/652,071

(22) PCT Filed: Dec. 26, 2013

(86) PCT No.: PCT/CN2013/090572
§ 371 (c)(1),
(2) Date: Jun. 12, 2015

(87) PCT Pub. No.: WO2014/101798
PCT Pub. Date: Jul. 3, 2014

(65) Prior Publication Data
US 2015/0333223 A1  Nov. 19, 2015

(30) Foreign Application Priority Data
Dec. 29, 2012  (CN) .......................... 2012 1 0588034

(51) Int. Cl.
*H01L 33/20*  (2010.01)
*H01L 33/00*  (2010.01)
(Continued)

(52) U.S. Cl.
CPC ............ *H01L 33/20* (2013.01); *H01L 33/007* (2013.01); *H01L 33/0025* (2013.01);
(Continued)

(58) Field of Classification Search
CPC ......... H01L 33/20; H01L 33/22; H01L 33/58; H01L 51/5268; H01L 2933/0091; H01L 33/24
See application file for complete search history.

(56) References Cited

U.S. PATENT DOCUMENTS

2006/0258163 A1*  11/2006  Ohashi .................. B81C 1/0046
                                                            438/735
2013/0119424 A1*  5/2013  Kang ...................... H01L 33/60
                                                             257/98
2013/0140592 A1*  6/2013  Lee ..................... H01L 33/0095
                                                             257/98

FOREIGN PATENT DOCUMENTS

| CN | 1983649 A | 6/2007 |
| CN | 102544266 A | 7/2012 |
| CN | 103066178 A | 4/2013 |

* cited by examiner

Primary Examiner — Minh-Loan Tran
Assistant Examiner — Leslie Pilar Cruz
(74) Attorney, Agent, or Firm — Muncy, Geissler, Olds & Lowe, P.C.

(57) ABSTRACT

A method of fabricating a flip-chip photonic-crystal light-emitting diode (LED) is disclosed. The method includes the steps of: providing an initial substrate including an epitaxial-growth surface and a light-output surface; performing a nanoimprint process on the epitaxial-growth surface of the initial substrate to form a nano-level patterned substrate; forming a flip-chip LED structure on the epitaxial-growth surface of the nano-level patterned substrate; and performing a nanoimprint process on the light-output surface of the nano-level patterned substrate to form the flip-chip photonic-crystal LED. The formation of the photonic-crystal structure on the light-output surface results in enhanced LED light extraction and emission efficiency.

14 Claims, 5 Drawing Sheets

(51) Int. Cl.
*H01L 33/06* (2010.01)
*H01L 33/10* (2010.01)
*H01L 33/32* (2010.01)
*H01L 33/64* (2010.01)
*H01L 33/22* (2010.01)

(52) U.S. Cl.
CPC .............. *H01L 33/06* (2013.01); *H01L 33/10* (2013.01); *H01L 33/22* (2013.01); *H01L 33/32* (2013.01); *H01L 33/64* (2013.01); *H01L 2933/0033* (2013.01); *H01L 2933/0075* (2013.01)

REVERSELY-INSTALLED PHOTONIC CRYSTAL LED CHIP AND METHOD FOR MANUFACTURING SAME

TECHNICAL FIELD

The present invention pertains to the field of light-emitting diode (LED) fabrication technology, and more particularly to a flip chip photonic-crystal LED and a fabrication method thereof.

BACKGROUND

A light-emitting diode (LED) is a solid-state semiconductor light-emitting device that incorporates a semiconductor PN junction as a light-emitting element for converting electricity to light. When a forward bias is applied to the two terminals of the PN junction, electrons are injected into the PN junction and recombine with holes therein, releasing excessive energy in the form of photons. LEDs have the advantages of a long service life and low power consumption, and with the technology evolving, LEDs are increasingly required to also have better performance in power and brightness. Examples of existing technologies that can improve LED power and brightness include flip chip LEDs, patterned substrates and high-voltage LED chips.

On the other hand, accompanying the maturing of photonic-crystal theory and associated technologies, photonic crystals have found some use in optical communication and information technology, and there have been some attempts made to introduce photonic crystals in LED fabrication to improve LED efficiency. A photonic crystal is a structure that is composed of periodically arranged elements having different refractive indexes and thus has a photonic-crystal band gap (analogous to a forbidden band of a semiconductor). As the periodic low-refractive-index elements are equally spaced, a photonic crystal with a certain length can only block light with a wavelength within a particular range. If the periodicity of the photonic crystal occurs only in a certain direction, then the band gap only exists in this direction to forbid light with energy within a range corresponding to the photonic band gap from propagating in the photonic crystal along the direction. As such, using particular photonic-crystal structures allows the manipulation of light propagation.

SUMMARY OF THE INVENTION

The present invention provides a flip-chip photonic-crystal LED and a method of fabricating the same. The flip-chip photonic-crystal LED incorporates a patterned substrate and a photonic-crystal structure formed by nanoimprint patterning an epitaxial-growth surface and a light-output surface of the substrate and hence has greatly improved LED working efficiency.

According to one aspect, the present invention provides a method of fabricating a flip-chip photonic-crystal LED. The method includes: providing an initial substrate including an epitaxial-growth surface and a light-output surface; performing a nanoimprint process on the epitaxial-growth surface of the initial substrate to form a nano-level patterned substrate; forming a flip-chip LED structure on the epitaxial-growth surface of the nano-level patterned substrate; and performing a nanoimprint process on the light-output surface of the nano-level patterned substrate to form a flip-chip photonic-crystal LED.

Optionally, performing the nanoimprint process on the epitaxial-growth surface of the initial substrate may include: cleaning the initial substrate and forming a first imprint resist layer on the epitaxial-growth surface of the initial substrate; pressing a first imprint mold onto the first imprint resist layer to transfer patterns of the first imprint mold into the first imprint resist layer; removing the first imprint mold and performing an etching process on the first imprint resist layer, thereby forming patterns in the epitaxial-growth surface of the initial substrate; and removing the first imprint resist layer to form the nano-level patterned substrate.

Optionally, the patterns of the first imprint mold may be first nano-level bumps and the first nano-level bumps are regularly arranged.

Optionally, the patterns of the first imprint mold may be first nano-level bumps and the first nano-level bumps are irregularly arranged.

Optionally, the patterns of the first imprint mold may be transferred into the first imprint resist layer by a thermoplastic curing process or an ultraviolet light curing process.

Optionally, forming the reversely-installed chip LED structure on the epitaxial-growth surface of the nano-level patterned substrate may include: growing an epitaxial layer over the epitaxial-growth surface of the nano-level patterned substrate, the epitaxial layer sequentially including an n-type gallium nitride layer, a multi-quantum well active layer and a p-type gallium nitride layer; etching the epitaxial layer to form therein a plurality of contact holes exposing portions of the n-type GaN layer; forming a metal reflector layer over the p-type GaN layer; forming an insulating layer over the metal reflector layer; patterning the insulating layer to form therein a plurality of openings exposing portions of the metal reflector layer and portions of the n-type GaN layer; forming a contact solder layer in the plurality of openings; and welding the contact solder layer onto a heat dissipation substrate using a welding process.

Optionally, performing the nanoimprint process on the light-output surface of the nano-level patterned substrate may include: forming a second imprint resist layer on the light-output surface of the nano-level patterned substrate; pressing a second imprint mold on the second imprint resist layer to transfer patterns of the second imprint mold into the second imprint resist layer; removing the second imprint mold and performing an etching process on the second imprint resist layer, thereby forming patterns in the light-output surface of the nano-level patterned substrate; and removing the second imprint resist layer to form a photonic-crystal structure.

Optionally, the patterns of the second imprint mold may be second nano-level bumps and the second nano-level bumps are regularly arranged and have a size and a pitch each in a same magnitude order as a wavelength of light emitted from the flip-chip photonic-crystal LED.

Optionally, the second nano-level bumps may assume a cylindrical or cuboid shape.

Optionally, the nano-level patterned substrate may be thinned prior to forming the second imprint resist layer on the light-output surface of the nano-level patterned substrate.

Optionally, the initial substrate may be a sapphire substrate.

According to another aspect, the present invention resides in a flip-chip photonic-crystal LED fabricated using the method described above. The flip-chip photonic-crystal LED includes a nano-level patterned, photonic-crystal substrate and a flip-chip LED structure, the nano-level patterned, photonic-crystal substrate comprising an epitaxial-growth surface and a light-output surface, the epitaxial-growth surface is formed therein with a nano-level pattern structure, the light-output surface being formed therein with a photonic-crystal structure, the flip-chip LED structure being formed on the epitaxial-growth surface.

Optionally, the flip-chip LED structure may include: an epitaxial layer grown over the epitaxial-growth surface of the nano-level patterned, photonic-crystal substrate, the epitaxial layer sequentially including an n-type GaN layer, a multi-quantum well active layer and a p-type GaN layer; a plurality of contact holes formed in the epitaxial layer, the plurality of contact holes exposing portions of the n-type GaN layer; a metal reflector layer overlying the p-type GaN layer; an insulating layer overlying the metal reflector layer; a plurality of openings formed in the insulating layer, the plurality of openings exposing portions of the metal reflector layer and portions of the n-type GaN layer; a contact solder layer formed in the plurality of openings; and a heat dissipation substrate welded to the contact solder layer.

Optionally, patterns of a second imprint mold used in a nanoimprint process for forming the photonic-crystal structure may be second nano-level bumps and the second nano-level bumps are regularly arranged and have a size and a pitch each in the same magnitude order as a wavelength of light emitted from the flip-chip photonic-crystal LED.

Optionally, the second nano-level bumps may assume a cylindrical or cuboid shape.

The method and the flip-chip photonic-crystal LED of the present invention achieve effective integration between a flip-chip photonic-crystal structure and an LED. In addition, through forming a patterned substrate and a photonic-crystal structure by nanoimprint patterning an epitaxial-growth surface and a light-output surface of the substrate, the method is capable of great improvement both in LED power and light-extraction efficiency.

DETAILED DESCRIPTION OF THE EXEMPLARY EMBODIMENTS

The present invention provides a flip-chip photonic-crystal LED and a method of fabricating the same, which can effectively combine a flip-chip photonic-crystal structure with an LED. Additionally, through forming a patterned substrate and a photonic-crystal structure by nanoimprint patterning an epitaxial-growth surface and a light-output surface of the substrate, the method is capable of great improvement both in LED power and light-extraction efficiency.

The present invention will be described in greater detail in the following description which demonstrates preferred embodiments of the invention, in conjunction with the accompanying drawings. Those of skill in the art should, in light of the present disclosure, appreciate that many changes can be made in the specific embodiments disclosed herein and still obtain the same beneficial results. Therefore, the following description should be construed as illustrative of the principles of the present invention, and not providing limitations thereto.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time consuming but would nevertheless be a routine undertaking for those of ordinary skill in the art.

The present invention will be further described in the following paragraphs by way of example with reference to the accompanying drawings. Features and advantages of the invention will be apparent from the following detailed description, and from the appended claims. Note that the accompanying drawings are provided in a very simplified form not necessarily presented to scale, with the only intention of facilitating convenience and clarity in explaining a few exemplary embodiments of the invention.

Figure 1:
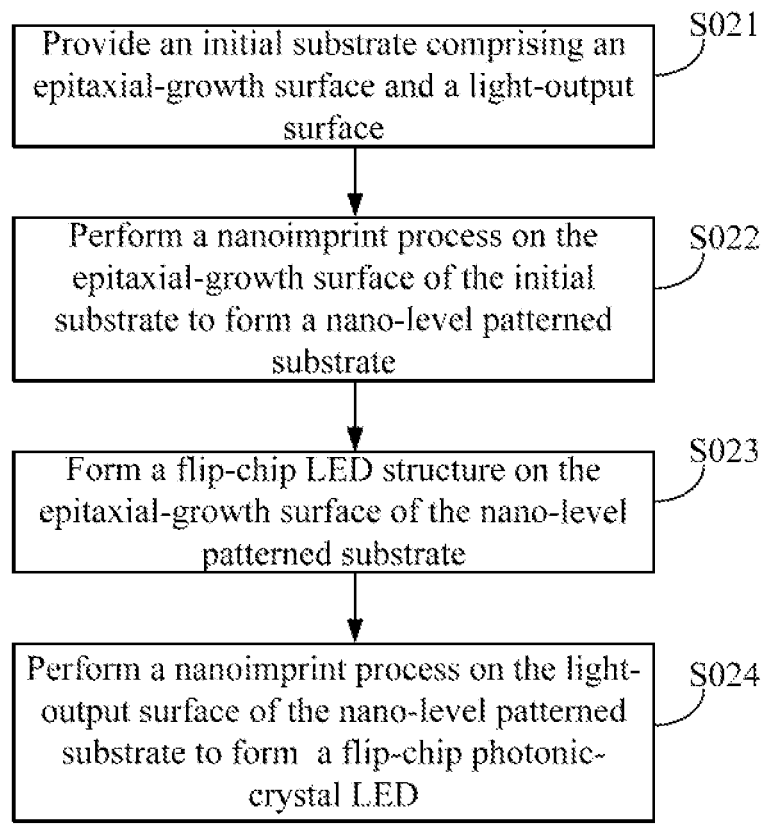
FIG. 1 is a flowchart illustrating a method of fabricating a flip-chip photonic-crystal LED in accordance with an embodiment of the present invention.

Referring to FIG. 1, which is a flowchart illustrating a method of fabricating a flip-chip photonic-crystal LED in accordance with an embodiment of the present invention. The method includes the steps of:

S021) providing an initial substrate comprising an epitaxial-growth surface and a light-output surface;

S022) performing a nanoimprint process on the epitaxial-growth surface of the initial substrate to form a nano-level patterned substrate;

S023) forming a flip-chip LED structure on the epitaxial-growth surface of the nano-level patterned substrate; and S024) performing a nanoimprint process on the light-output surface of the nano-level patterned substrate to form thereon a photonic-crystal structure.

Figure 2A:
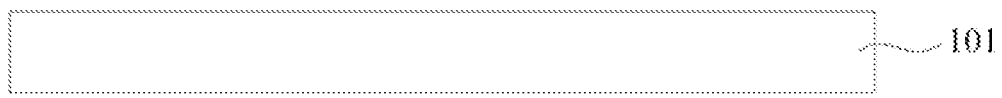
FIGS. 2A to 2Q are schematics illustrating the fabrication steps of the method of fabricating a flip-chip photonic-crystal LED in accordance with the embodiment of the present invention.

Referring to FIG. 2A, in step S021, the initial substrate 101 is provided, and the initial substrate 101 includes the epitaxial-growth surface and the light-output surface. The epitaxial-growth surface is for the growth of an epitaxial layer thereon in subsequent processes, and the light-output surface is for light to emit from the formed device. In this embodiment, the initial substrate 101 is a sapphire substrate.

Figure 2B:
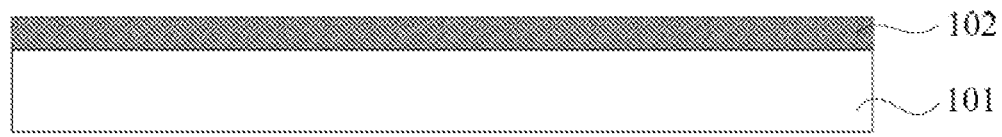
Figure 2C:
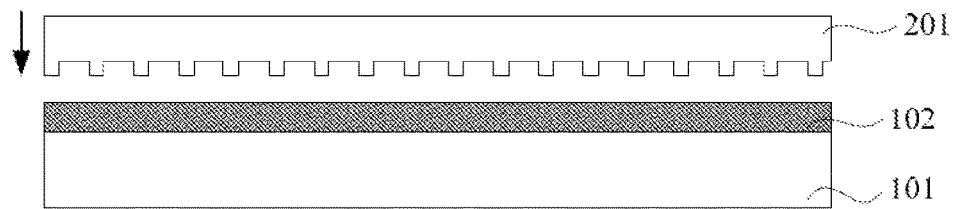
Figure 2D:
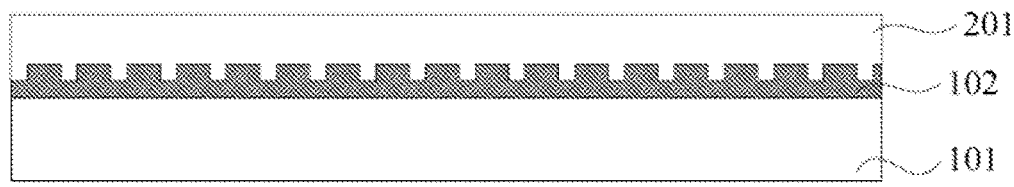
Figure 2E:
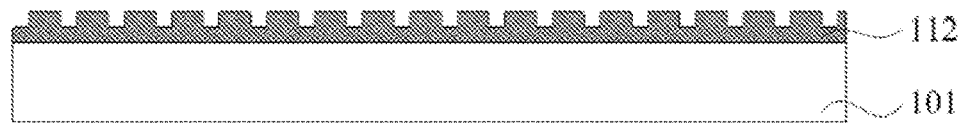
Figure 2F:
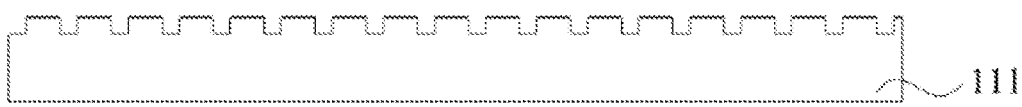

Referring to FIGS. 2B to 2F, in step S022, the nanoimprint process is performed on the epitaxial-growth surface of the initial substrate 101 to form the nano-level patterned substrate 111. Specifically, performing the nanoimprint process on the epitaxial-growth surface may further include the steps of: cleaning the initial substrate 101 and forming a first imprint resist layer 102 on the epitaxial-growth surface of the initial substrate, as shown in FIG. 2B; pressing a first imprint mold 201 onto the first imprint resist layer 102 to transfer patterns of the first imprint mold 201 into the first imprint resist layer 102, thereby forming a patterned first imprint resist layer 112, as shown in FIGS. 2C to 2E; removing the first imprint mold 201 and performing an etching process on the patterned first imprint resist layer 112, thereby forming patterns in the epitaxial-growth surface of the initial substrate, as shown in FIG. 2F; and removing the first imprint resist layer 112 to form the nano-level patterned substrate 111.

The patterns in the nano-level patterned substrate 111 may be regularly or irregularly arranged. Therefore, the patterns of the first imprint mold 201 may be the first nano-level bumps which are regularly or irregularly arranged. In this embodiment, the patterns of the first imprint mold 201 are first nano-level bumps which are regularly arranged. A process that is commonly used to transfer the patterns of the first imprint mold 201 to the first imprint resist layer 102 may be a thermoplastic curing process or an ultraviolet (UV) light curing process. In an embodiment using the UV light curing process, the first imprint mold 201 may be formed of a UV-transparent material such as, for example, quartz glass and polydimethylsiloxane (PDMS) and the first imprint resist layer 102 may be made from a low-viscosity, photo-curable solution. During the pattern transfer process, the first imprint resist layer 102 may be cured by UV light from the first imprint mold 201 which is being pressed on the first imprint resist layer 102, and the patterned first imprint resist layer 112 is formed after the first imprint mold 201 is removed for accomplishing the pattern transfer. In an embodiment using the thermoplastic curing process, the first imprint resist layer 102 may be formed of a thermoplastic material, such as polymethylmethacrylate (PMMA), which may be heated first until the first imprint resist layer 102 has a lower viscosity and an improved fluidity. The first imprint mold 201 may be then pressed on the heated first imprint resist layer 102 with a certain pressure. Afterward, the first imprint resist layer 102 may be cooled down and cured, and the patterned first imprint resist layer 112 is formed after the first imprint mold 201 is removed for accomplishing the pattern transfer.

After the patterns of the first imprint mold 201 are transferred into the first imprint resist layer 102, the patterned first imprint resist layer 112 may serve as a mask in etching the epitaxial-growth surface anisotropically, for example, by an inductively coupled plasma (ICP) etching process or a reactive ion etching (RIE) process, to further form the patterns in the epitaxial-growth surface. Thereafter, the reminder of the patterned first imprint resist layer 112 may be removed to form the nano-level patterned substrate 111. The nano-level patterned substrate 111 can result in reduction of dislocation density and defect generation during epitaxial growth and is therefore conducive to improving internal-quantum efficiency and power.

Figure 2G:
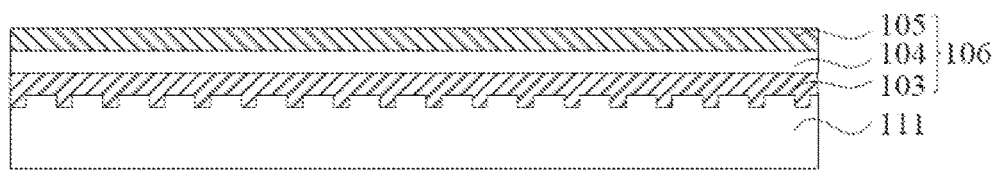
Figure 2H:
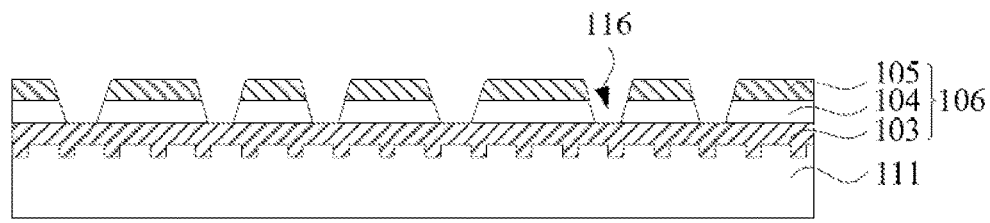
Figure 2I:
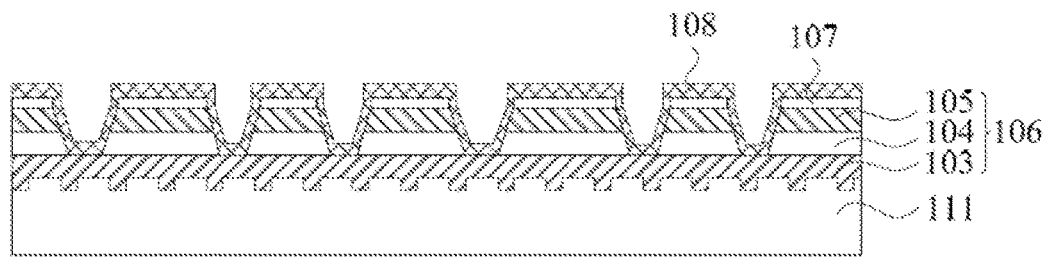
Figure 2J:
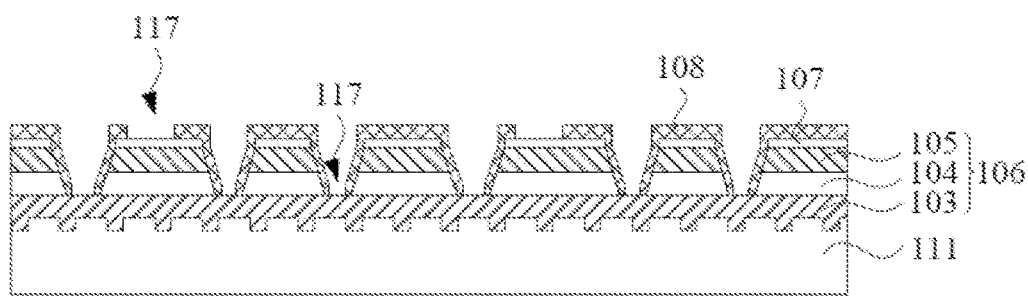
Figure 2K:
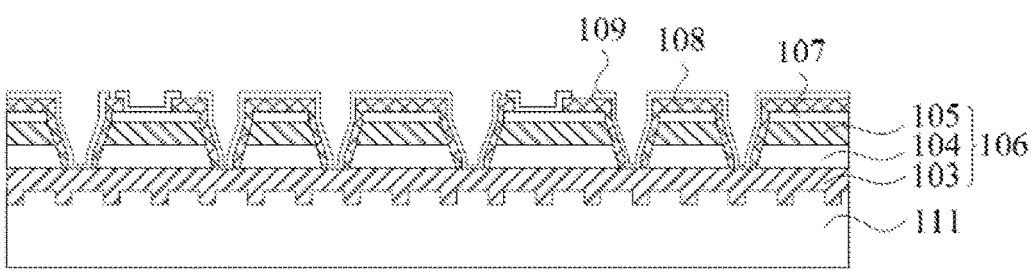
Figure 2L:
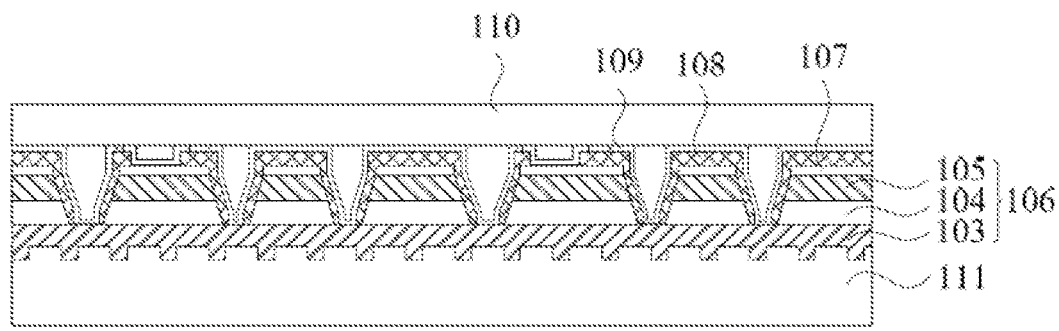
Figure 2M:
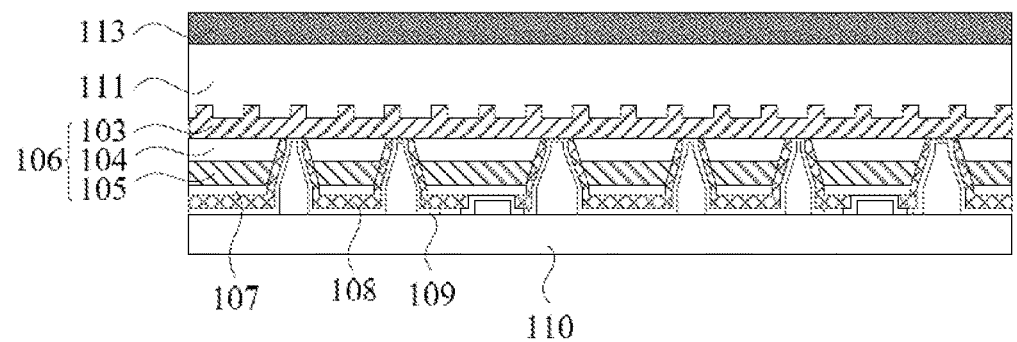
Figure 2N:
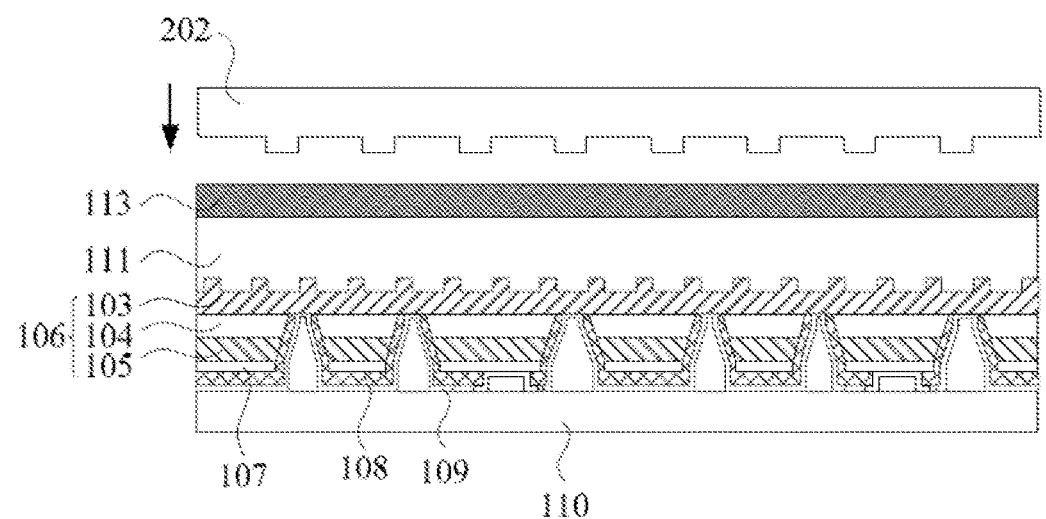
Figure 2O:
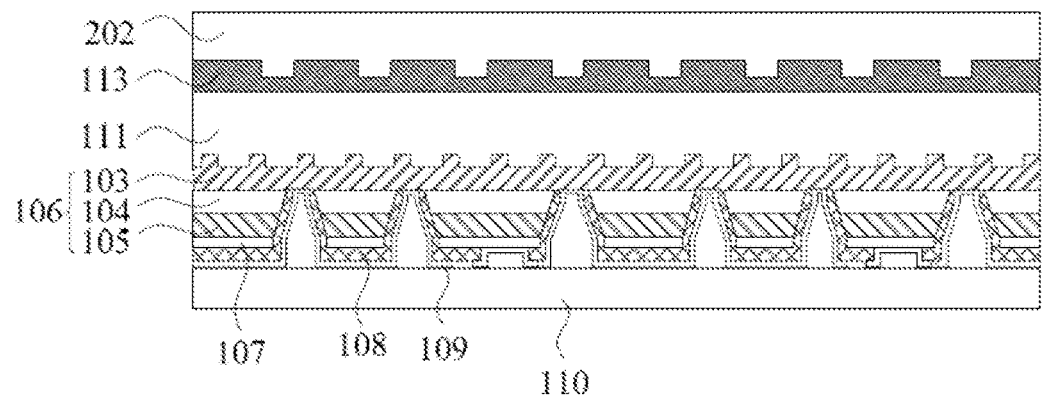
Figure 2P:
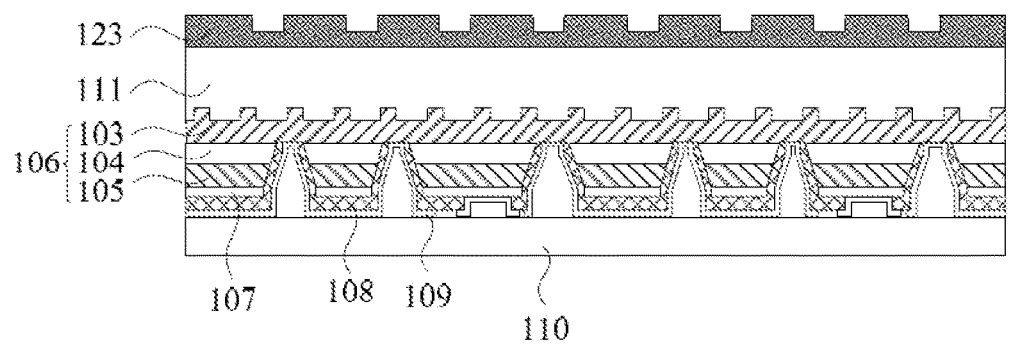

Referring to FIGS. 2G to 2L, in step S023, the flip-chip LED structure is formed on the epitaxial-growth surface of the nano-level patterned substrate 111. The formation of the flip-chip LED structure may further include the steps of: growing an epitaxial layer 106 over the epitaxial-growth surface, the epitaxial layer 106 including an n-type gallium nitride (GaN) layer 103, a multi-quantum well active layer 104 and a p-type GaN layer 105, which are formed sequentially in the order, as shown in FIG. 2G; etching the epitaxial layer 106 to form therein a plurality of contact holes 116 which expose portions of the underlying n-type GaN layer 103, as shown in FIG. 2H; forming a metal reflector layer 107 over the p-type GaN layer 105 and an insulating layer 108 over the metal reflector layer 107, as shown in FIG. 2I; patterning the insulating layer 108 to form a plurality of openings 117 which expose portions of the metal reflector layer 107 and portions of the n-type GaN layer 103, as shown in FIG. 2J; forming a contact solder layer 109 over the insulating layer 108, as shown in FIG. 2K; and welding the contact solder layer 109 onto a heat dissipation substrate 110 using a welding process, as shown in FIG. 2L. Because the formation of the flip-chip LED structure is a process known by those skilled in the art and also because the present invention makes no improvement therein, specific description of the steps thereof are omitted herein.

Referring to FIGS. 2M to 2Q, in step S024, the nanoimprint process is performed on the light-output surface of the nano-level patterned substrate 111 to form thereon the photonic-crystal structure. In this embodiment, the photonic-crystal structure is a structure composed of the substrate material and air periodically arranged on the light-output surface. The formation of the photonic-crystal structure may be similar to that of the nano-level patterned substrate and may include the steps of: forming a second imprint resist layer 113 on the light-output surface; pressing a second imprint mold 202 on the second imprint resist layer 113 to transfer patterns of the second imprint mold 202 into the second imprint resist layer 113; removing the second imprint mold 202 and performing an etching process on the second imprint resist layer 113, thereby forming the patterns in the light-output surface of the nano-level patterned substrate 111; and removing the second imprint resist layer 113 to form a nano-level patterned, photonic-crystal substrate 121.

The patterns of the second imprint mold 202 may be second nano-level bumps which are regularly arranged and have a size and a pitch each in the same magnitude order as a wavelength of light emitted from the flip-chip photonic-crystal LED, such that the second imprint mold results in the formation of a structure constituted of the substrate material and air periodically arranged on the light-output surface, i.e., the photonic-crystal structure, which forms a photonic band gap in each direction on the light-output surface, wherein the photonic band gap corresponds to an energy range including the energy of the emitted light. As a result, light entering the photonic-crystal structure is forbidden from propagating along the light-output surface.

By way of example, for an LED chip that emits blue light with a wavelength of 460 nm, the photonic-crystal structure formed in the light-output surface may be cylindrical holes which are regularly arranged and have a diameter of 200-600 nm, a depth of 100-300 nm and a pitch of 400-800 nm between adjacent holes. With such structure, light emitted from the LED chip cannot transmit in the direction of the periodicity of the photonic-crystal structure and has to emit from the light-output surface. It is a matter of course that the regularly arranged features of the photonic-crystal structure are not limited to the above described cylindrical holes, as they may assume other forms, for example, regularly arranged cuboid holes or cylindrical bumps. The second nano-level bumps may assume a cylindrical or cuboid shape, and different shapes result in different photonic-crystal structures. In light of the principal inventive concepts, those skilled in the art can make different photonic-crystal structures for LED chips having different emission wavelengths. Regardless, in order to control the size of the flip-chip photonic-crystal LED, the substrate may be thinned prior to the formation of the second imprint resist layer. Further, according to the actually used imprint process (i.e., thermoplastic curing process or UV light curing process), the second imprint resist layer may be formed of different materials and patterned by different methods. As the process for forming the second imprint resist layer is similar to the process for forming the first imprint resist layer, reference can be made and detailed description of it is omitted herein for simplicity.

Figure 2Q:
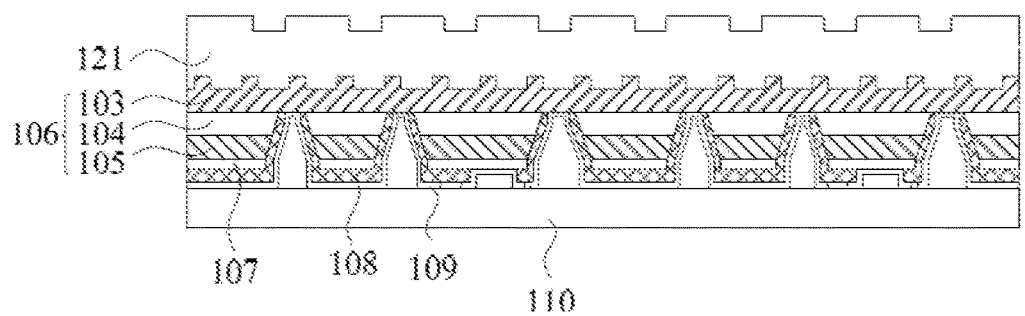

In another aspect, the present invention provides a flip-chip photonic-crystal LED fabricated using the method described in the foregoing embodiment. As shown in FIG. 2Q, the flip-chip photonic-crystal LED includes: a nano-level patterned, photonic-crystal substrate 121 which includes an epitaxial-growth surface and a light-output surface, the epitaxial-growth surface being formed therein with a nano-level pattern structure, the light-output surface being formed therein with a photonic-crystal structure; and a flip-chip LED structure formed on the epitaxial-growth surface.

The flip-chip LED structure may include: an epitaxial layer 106 formed over the epitaxial-growth surface of the nano-level patterned, photonic-crystal substrate, the epitaxial layer including an n-type GaN layer 103, a multi-quantum well active layer 104 and a p-type GaN layer 105, which are formed sequentially in the order; a plurality of contact holes formed in the epitaxial layer, the plurality of contact holes exposing portions of the n-type GaN layer 103; a metal reflector layer 107 overlying the p-type GaN layer 105; an insulating layer 108 overlying the metal reflector layer 107; a plurality of openings formed in the insulating layer 108, the plurality of openings exposing portions of the metal reflector layer 107 and portions of the n-type GaN layer 103; and a contact solder layer 109 formed over the insulating layer 108 and a heat dissipation substrate 110 welded to the contact solder layer 109.

Thanks to the patterned substrate, this structure can result in reduction of dislocation density and defect generation during epitaxial growth and is therefore conducive to improving internal quantum efficiency and power. In addition, forming the photonic-crystal structure on the light-output surface enables an increase in the light-extraction efficiency and a further improvement in LED working efficiency.

As described above, the present invention provides a flip-chip photonic-crystal LED and a method of fabricating the same. The flip-chip photonic-crystal LED incorporates a patterned substrate and a photonic-crystal structure formed by nanoimprint patterning an epitaxial-growth surface and a light-output surface of the substrate and hence has greatly improved LED working efficiency.

Obviously, those skilled in the art may make various modifications and alterations without departing from the spirit and scope of the invention. It is therefore in-tended that the invention be construed as including all such modifications and alterations insofar as they fall within the scope of the appended claims or equivalents thereof.

What is claimed is:

1. A method of fabricating a flip-chip photonic-crystal light-emitting diode (LED), comprising:
   providing an initial substrate comprising an epitaxial-growth surface and a light-output surface;
   performing a nanoimprint process on the epitaxial-growth surface of the initial substrate to form a nano-level patterned substrate;
   forming a flip-chip LED structure on the epitaxial-growth surface of the nano-level patterned substrate; and
   performing a nanoimprint process on the light-output surface of the nano-level patterned substrate to form a flip-chip photonic-crystal LED,
   wherein performing the nanoimprint process on the epitaxial-growth surface of the initial substrate includes:
   cleaning the initial substrate and forming a first imprint resist layer on the epitaxial-growth surface of the initial substrate;
   pressing a first imprint mold onto the first imprint resist layer to transfer patterns of the first imprint mold into the first imprint resist layer;
   removing the first imprint mold and performing an etching process on the first imprint resist layer, thereby forming patterns in the epitaxial-growth surface of the initial substrate; and
   removing the first imprint resist layer to form the nano-level patterned substrate.

2. The method of claim 1, wherein the patterns of the first imprint mold are first nano-level bumps and the first nano-level bumps are regularly arranged.

3. The method of claim 1, wherein the patterns of the first imprint mold are first nano-level bumps and the first nano-level bumps are irregularly arranged.

4. The method of claim 1, wherein the patterns of the first imprint mold are transferred into the first imprint resist layer by a thermoplastic curing process or an ultraviolet light curing process.

5. The method of claim 1, wherein forming the flip-chip LED structure on the epitaxial-growth surface of the nano-level patterned substrate includes:
   growing an epitaxial layer over the epitaxial-growth surface of the nano-level patterned substrate, the epitaxial layer sequentially including an n-type gallium nitride layer, a multi-quantum well active layer and a p-type gallium nitride layer;
   etching the epitaxial layer to form therein a plurality of contact holes exposing portions of the n-type GaN layer;
   forming a metal reflector layer over the p-type GaN layer;
   forming an insulating layer over the metal reflector layer;
   patterning the insulating layer to form therein a plurality of openings exposing portions of the metal reflector layer and portions of the n-type GaN layer;
   forming a contact solder layer in the plurality of openings; and
   welding the contact solder layer onto a heat dissipation substrate using a welding process.

6. The method of claim 1, wherein performing the nanoimprint process on the light-output surface of the nano-level patterned substrate includes:
   forming a second imprint resist layer on the light-output surface of the nano-level patterned substrate;
   pressing a second imprint mold on the second imprint resist layer to transfer patterns of the second imprint mold into the second imprint resist layer;
   removing the second imprint mold and performing an etching process on the second imprint resist layer, thereby forming patterns in the light-output surface of the nano-level patterned substrate; and
   removing the second imprint resist layer to form a photonic-crystal structure.

7. The method of claim 6, wherein the patterns of the second imprint mold are second nano-level bumps and the second nano-level bumps are regularly arranged and have a size and a pitch each in a same magnitude order as a wavelength of light emitted from the flip-chip photonic-crystal LED.

8. The method of claim 7, wherein the second nano-level bumps have a cylindrical or cuboid shape.

9. The method of claim 6, wherein the nano-level patterned substrate is thinned prior to forming the second imprint resist layer on the light-output surface of the nano-level patterned substrate.

10. The method of any of claim 1 wherein the initial substrate is a sapphire substrate.

11. A flip-chip photonic-crystal light-emitting diode (LED) flip-chip fabricated using the method as defined in claim 1, comprising:
    a nano-level patterned, photonic-crystal substrate and a flip-chip LED structure, the nano-level patterned, photonic-crystal substrate comprising an epitaxial-growth surface and a light-output surface, the epitaxial-growth surface being formed therein with a nano-level pattern structure, the light-output surface being formed therein with a photonic-crystal structure, the flip-chip LED structure being formed on the epitaxial-growth surface.

12. The flip-chip photonic-crystal LED of claim 11, wherein the flip-chip LED structure comprises:
   an epitaxial layer grown over the epitaxial-growth surface of the nano-level patterned, photonic-crystal substrate, the epitaxial layer sequentially including an n-type GaN layer, a multi-quantum well active layer and a p-type GaN layer;
   a plurality of contact holes formed in the epitaxial layer, the plurality of contact holes exposing portions of the n-type GaN layer;
   a metal reflector layer overlying the p-type GaN layer;
   an insulating layer overlying the metal reflector layer;
   a plurality of openings formed in the insulating layer, the plurality of openings exposing portions of the metal reflector layer and portions of the n-type GaN layer;
   a contact solder layer formed in the plurality of openings; and
   a heat dissipation substrate welded to the contact solder layer.

13. The flip-chip photonic-crystal LED of claim 11, wherein patterns of a second imprint mold used in the nanoimprint process for forming the photonic-crystal structure are second nano-level bumps and the second nano-level bumps are regularly arranged and have a size and a pitch each in the same magnitude order as a wavelength of light emitted from the flip-chip photonic-crystal LED.

14. The flip-chip photonic-crystal LED of claim 13, wherein the second nano-level bumps have a cylindrical or cuboid shape.

* * * * *